US006795325B1

(12) United States Patent
Inoue (10) Patent No.: US 6,795,325 B1
(45) Date of Patent: Sep. 21, 2004

(54) SEMICONDUCTOR MEMORY (75) Inventor: Kazunari Inoue, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/715,455

(22) Filed: Nov. 19, 2003

(30) Foreign Application Priority Data

Mar. 26, 2003 (JP) ........................................ 2003-085924

(51) Int. Cl.⁷ .............................................. G11C 15/00
(52) U.S. Cl. ........................... 365/49; 365/203; 711/108
(58) Field of Search ......................... 365/49, 203, 104, 365/189.06, 189.07; 711/108

(56) References Cited

U.S. PATENT DOCUMENTS

| 5,949,696 | A | 9/1999 | Threewitt | |
|---|---|---|---|---|
| 6,320,777 | B1 | 11/2001 | Lines et al. | |
| 6,674,660 | B2 * | 1/2004 | Shau | 365/49 |
| 6,697,277 | B2 * | 2/2004 | Towler et al. | 365/49 |

FOREIGN PATENT DOCUMENTS

JP          2002-237190      8/2002

OTHER PUBLICATIONS

"The Next Generation of Content Addressable Memories," MOSAID Technologies Incorporated, Sep. 1999, pp. 1–7.

* cited by examiner

Primary Examiner—Van Thu Nguyen
Assistant Examiner—Hien Nguyen
(74) Attorney, Agent, or Firm—Burns, Doane, Swecker & Mathis, L.L.P.

(57) ABSTRACT

A semiconductor memory can reduce its power consumption by decreasing the activation frequency of search lines during search operation. It includes a CAM cell block for storing memory data expressing each combination of digital values stored in four memory cells in terms of a 2-bit digital value; search lines on which a digital value to be matched with a digital value stored in the memory cells is placed; a search data setting section for placing individual 1-bit digital values on the search lines connected to the memory cells to set the search data expressing a 4-bit combination of digital values in terms of the 2-bit digital value; transistors for deciding match/mismatch between the memory data and search data; and the match line 3 for outputting the decision result.

5 Claims, 9 Drawing Sheets

| | SEARCH "00" 5a=1,5b=0,5c=0,5d=0 | SEARCH "01" 5a=0,5b=1,5c=0,5d=0 | SEARCH "10" 5a=0,5b=0,5c=1,5d=0 | SEARCH "11" 5a=0,5b=0,5c=0,5d=1 |
|---|---|---|---|---|
| STORE "xx" 1a=0,1b=0,1c=0,1d=0 | | | | |
| STORE "x0" 1a=0,1b=1,1c=0,1d=1 | | DISCHARGE | | DISCHARGE |
| STORE "x1" 1a=1,1b=0,1c=1,1d=0 | DISCHARGE | | DISCHARGE | |
| STORE "0x" 1a=0,1b=0,1c=1,1d=1 | | | DISCHARGE | DISCHARGE |
| STORE "00" 1a=0,1b=1,1c=1,1d=1 | | DISCHARGE | DISCHARGE | DISCHARGE |
| STORE "01" 1a=1,1b=0,1c=1,1d=1 | DISCHARGE | | DISCHARGE | DISCHARGE |
| STORE "1x" 1a=1,1b=1,1c=0,1d=0 | DISCHARGE | DISCHARGE | | |
| STORE "10" 1a=1,1b=1,1c=0,1d=1 | DISCHARGE | DISCHARGE | | DISCHARGE |
| STORE "11" 1a=1,1b=1,1c=1,1d=0 | DISCHARGE | DISCHARGE | DISCHARGE | |

FIG.7B (a) SEARCH LINE (b) PRECHARGE (c) MATCH LINE

SEMICONDUCTOR MEMORY

BACKGROUND OF THE INVENTION

1. Field of the Invention

The present invention relates to a semiconductor memory including CAM (Content Addressable Memory) cells.

2. Description of Related Art

Recently, a semiconductor memory composed of T-CAM (Ternary-Content Addressable Memory) cells has come to be used in a search system of a network address path. A configuration of a T-CAM cell is shown in FIG. 12 of a Relevant Reference 1, for example. It includes two memory cells with a RAM structure for expressing ternary data "0", "1" and "X (Don't care)". Each memory cell is connected to a pair of search lines for searching for binary data "0" and "1". In addition, each CAM cell is connected to a match line for indicating a match result between the search data on the search lines and the memory data in the memory cells.

Next, the outline of the search operation will be described.

First, the match line is charged to a high level, and one of the search data "0" and "1" is set on the search lines. Subsequently, matching is carried out between the search data on the search lines and the memory data in the memory cells (one of the values "0", "1" and "X"). If the two data match, the match line is maintained at the high level, and a decision is made as "match" as the search result. In other words, a decision is made that the search data is present at the address having that memory data. On the contrary, if the two data do not match, the match line is discharged to a low level, and a decision is made that the search result is "mismatch". A series of the search operation is repeated in search cycles synchronizing to an external clock.

Relevant Reference 1: Japanese patent application laid-open No. 2002-237190.

The conventional semiconductor memory composed of the CAM cells has a problem of consuming very large power in the search operation because it activates all the search lines at every search cycle.

The problem will be described in more detail by way of example.

Figure 9:
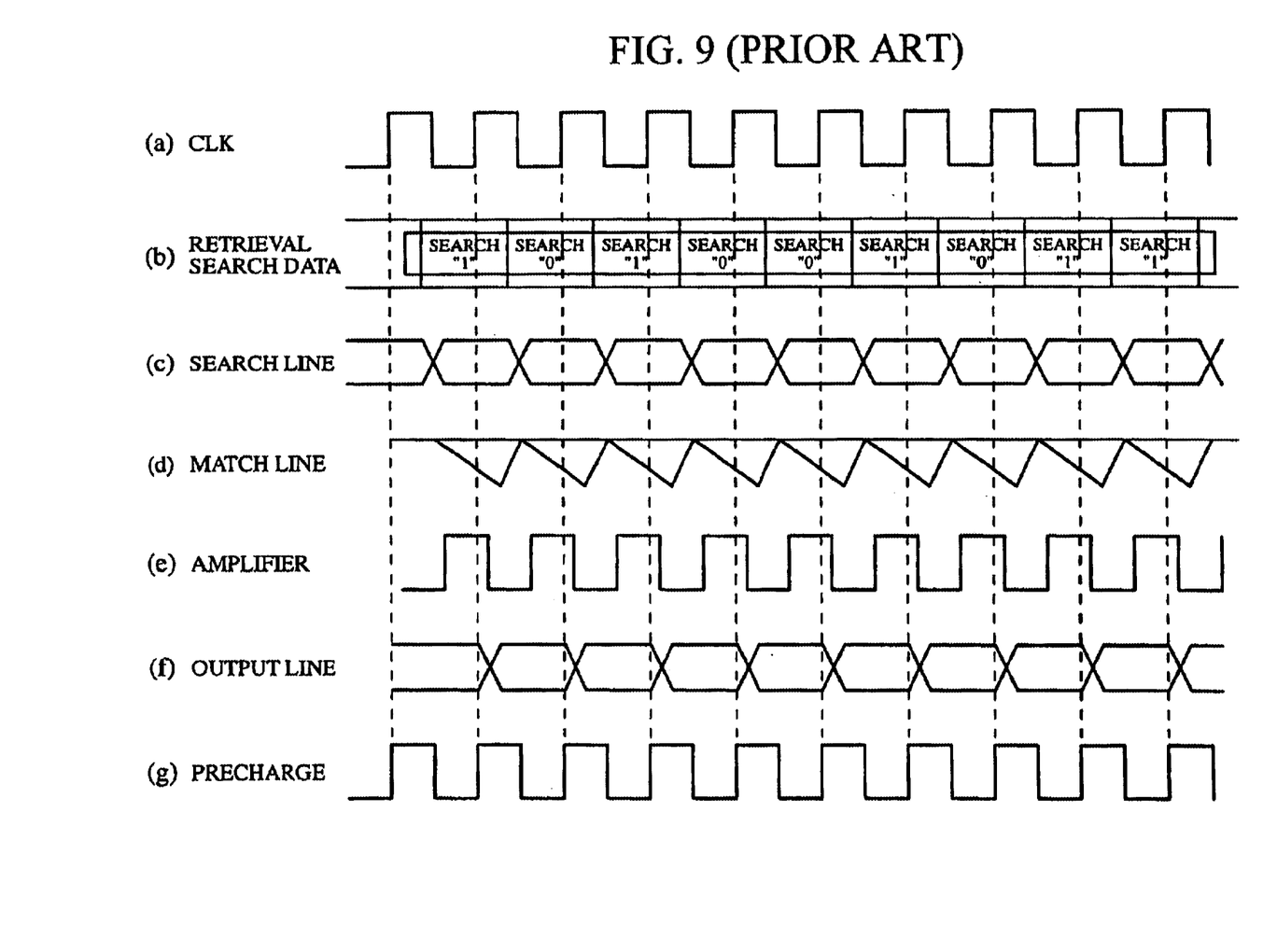
FIG. 9 is a timing chart illustrating the search operation of a conventional semiconductor memory composed of T-CAM cells.

FIG. 9 is a timing chart illustrating a search operation of a semiconductor memory composed of the conventional T-CAM cells. In FIG. 9, "CLK" designates the external clock supplied from the outside. The search operation is carried out in search cycles synchronized to the external clock. In FIG. 9, "RETRIEVAL SEARCH DATA" designates the search data that is being searched for. In addition, "AMP", "OUTPUT LINE" and "PRECHARGE" designate the operation of an amplifier for amplifying the output from the match line constituting a search result, the output value of the amplifier, and the state of the match line precharged to the high level before the search operation, respectively.

As illustrated in FIG. 9, the search lines repeat an inversion to either all "0" or all "1" at every search cycle in response to the search data supplied from the outside in the search operation. When the data values of all the search lines are inverted at every search cycle, the power consumption for executing a search instruction becomes very large. For example, a 9 M-bit class T-CAM consumes power of about 10 watts for a 100 MHz search cycle.

SUMMARY OF THE INVENTION

The present invention is implemented to solve the foregoing problem. It is therefore an object of the present invention to provide a semiconductor memory capable of reducing the power consumption by decreasing the activation frequency of the search lines in the search operation.

According to a first aspect of the present invention, there is provided a semiconductor memory comprising: a memory cell block that consists of L memory cells each for storing 1-bit digital value, where L is an integer equal to mth power of 2, and stores memory data expressing a combination of digital values stored in the individual memory cells in terms of an M-bit digital value, where M is a positive integer equal to or greater than two; search lines on which 1-bit digital values are set to be matched with the digital values stored in the memory cells; a search data setting section for setting search data expressing the combination of the L-bit digital values in terms of the M-bit digital value by setting the 1-bit digital values on the L search lines; a match section for making a match/mismatch decision between the memory data and the search data by matching the digital value stored in the memory cells constituting the memory cell block with the digital value set on the search lines connected to the memory cells; and an output section for outputting a decision result of the match section. Thus, it can reduce the activation frequency of the search lines during the search operation, thereby offering an advantage of being able to reduce the power consumption in the search operation.

DETAILED DESCRIPTION OF THE PREFERRED EMBODIMENTS

The invention will now be described with reference to the accompanying drawings.

Embodiment 1

Figure 1:
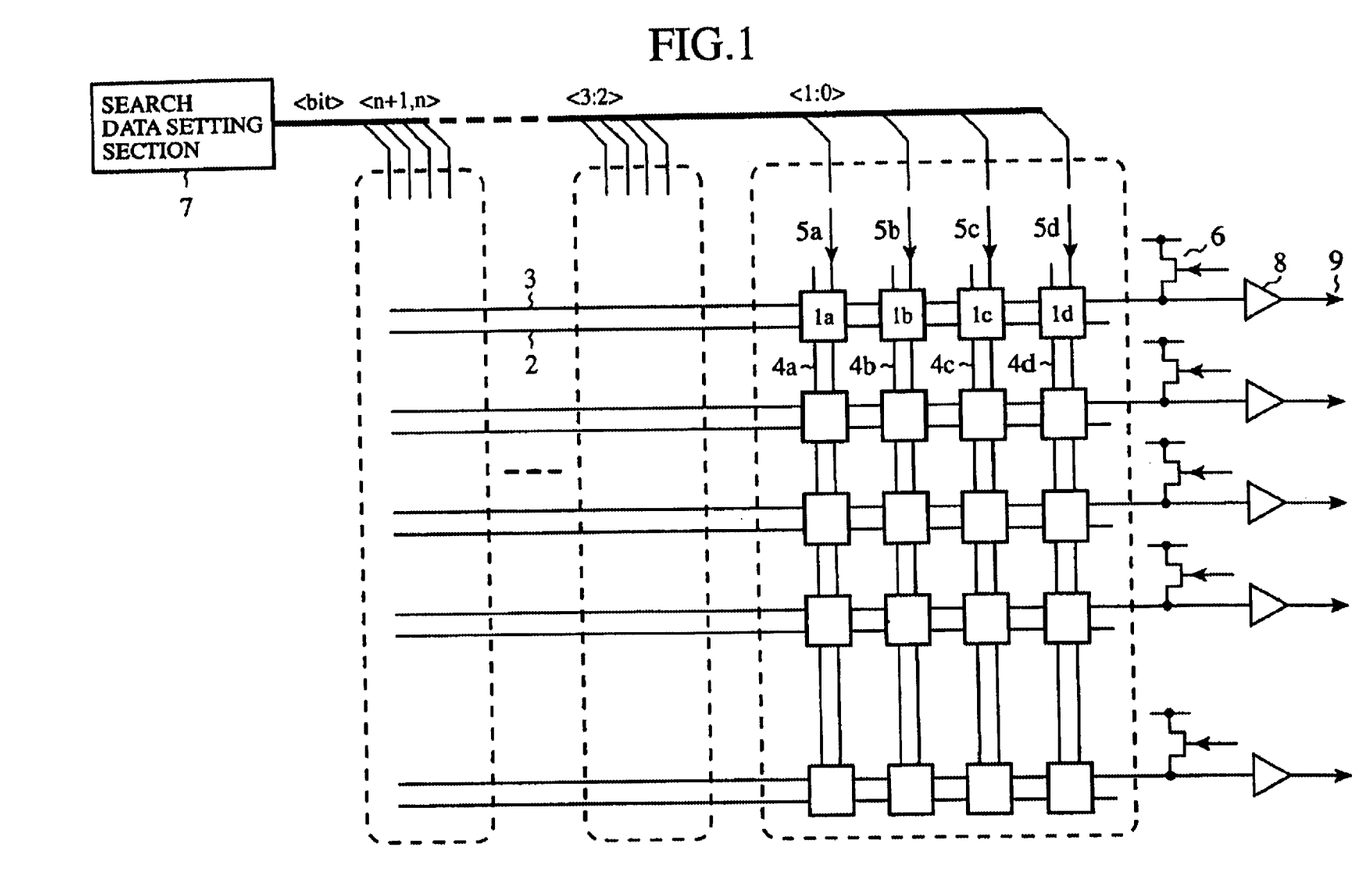
FIG. 1 is a block diagram showing a configuration of an embodiment 1 of the semiconductor memory in accordance with the present invention.

FIG. 1 is a block diagram showing a configuration of an embodiment 1 of the semiconductor memory in accordance with the present invention. The present embodiment 1 of the semiconductor memory has a memory cell array including subsets, each of which consists of four memory cells 1a–1d for storing 1-bit digital value. The memory cell array is structured by placing memory cells at intersections of a lattice consisting of word lines 2 and bit lines intersecting to each other. The word lines 2, which are connected to the memory cells, are charged to select the memory cells to undergo data write or data read. The bit lines 4a–4d transfer the digital data to be written to or read from the memory cells.

The semiconductor memory further comprises components necessary to operate as the CAM such as match lines (output section) 3 and search lines 5a–5d. Each match line 3 changes its charge state depending on the match/mismatch between the digital value stored in the memory cells 4a–4d and the digital value set on the search lines 5a–5d. The search lines 5a–5d are connected to the memory cells 1a–1d to set the digital value as the search data. The present embodiment 1 of the semiconductor memory further includes transistors (charge processor) 6 for charging match lines 3 with charges fed from a power supply not shown; a search data setting section 7 for placing search data on the search lines; amplifiers 8 for amplifying the outputs of the match lines 3; and output terminals 9 of the amplifiers.

In FIG. 1, <1:0>, <3:2>, ..., <n+1n> designate 0th bit, first bit, second bit, third bit, ..., nth bit, and (n+1)th bit of a bit string constituting the search data. The value of each bit corresponds to a value set in a CAM cell consisting of a pair of memory cells. In FIG. 1, a row direction of the memory cell array (direction along the word lines 2) denotes a data string (bitstring of memory data) to be compared, and a column direction (direction along the bit lines 4a–4d) denotes addresses for storing individual data strings.

For example, 0th address, the first row of the memory cells of the memory cell array, stores the digital values of the memory data "00110101xx" in its memory cells, and the first address, the second row of the memory cells of the memory cell array, stores the digital values of the memory data "0101001xxxx" in its memory cells.

In the memory cell array, the memory cells 1a and 1b, and memory cells 1c and 1d each have a function of a CAM cell for expressing ternary values "0", "1" and "X (don't care)", and the four memory cells 4a–4d together constitute one CAM cell block (memory cell block). Such CAM cell blocks are placed in a lattice formed by the word lines and bit lines to form the memory cell array. In addition, the search line is provided for each memory cell column of the memory cell array, and the match line 3 is provided for each memory cell row of the memory cell array.

Figure 2:
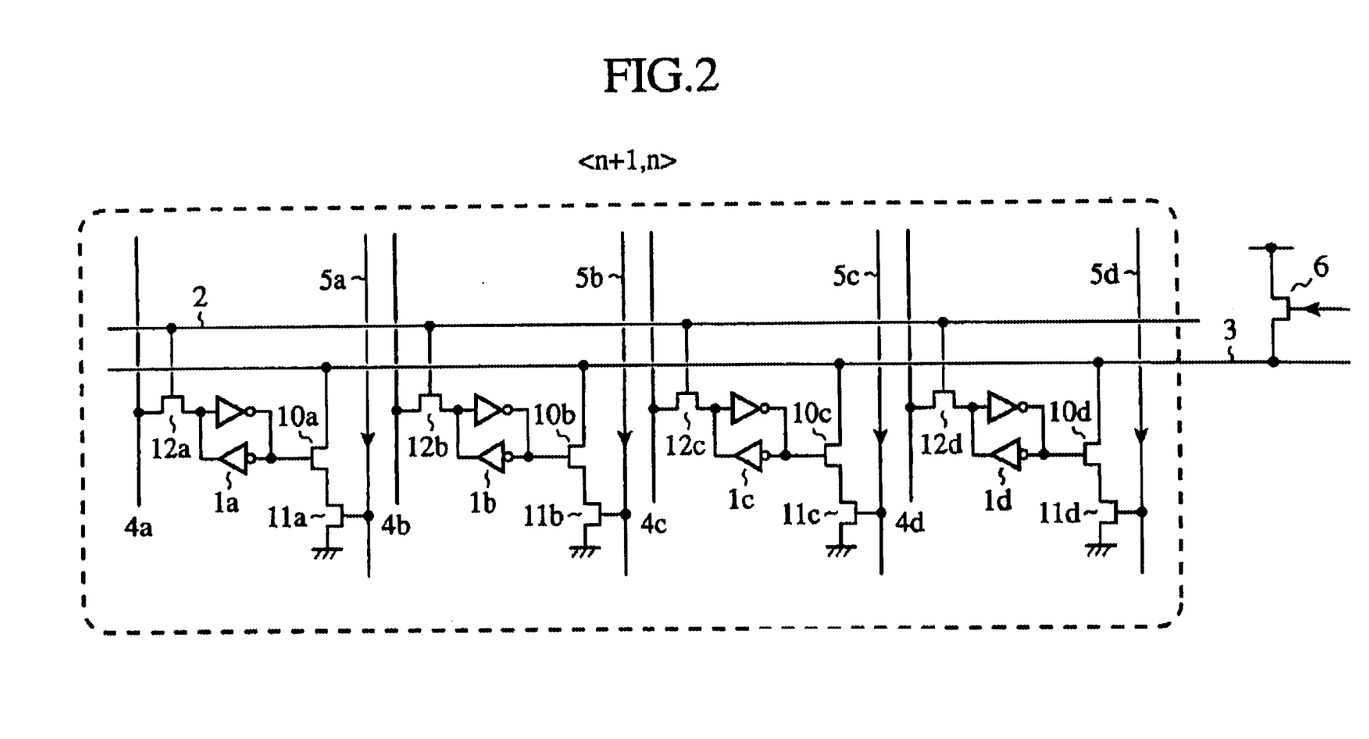
FIG. 2 is a circuit diagram showing a configuration of a CAM cell block in FIG. 1.

FIG. 2 is a circuit diagram showing a configuration of one of the CAM cell blocks in FIG. 1, which correspond to <n+1:n> of the search data. As shown in FIG. 2, the memory section of each of the memory cells 1a–1d is composed of a pair of inverters whose output terminals are connected to input terminals of the other. The memory cells 1a–1d are placed in correspondence with the lattice points consisting of the word line 2 and bit lines 4a–4d. Transistors 12a–12d are disposed between the memory sections of the memory cells 1a–1d and the word line 2 and bit lines 4a–4d. The transistors 12a–12d have their gate electrodes connected to the word line 2 in common for all the memory cells 1a–1d, and their source electrodes connected to the bit lines 4a–4d, respectively.

To write data to or read data from the memory cells 1a–1d, the word line 2 is activated so that the bit lines 4a–4d are connected to the memory sections via the transistors 12a–12d. Then, the data is written to or read from the memory sections via the bit lines 4a–4d. To operate as the CAM cell, the search lines 5a–5d are provided for the memory cells 1a–1d, and the match line 3 is provided in common to the memory cells 1a–1d along the word line 2. The match line 3 is connected to the drain electrodes of the transistors 10a–10d of the memory cells 1a–1d.

The transistors 10a–10d have their gate electrodes connected to the memory sections of the memory cells 1a–1d, and their source electrodes connected to the source electrodes of the transistors 11a–11d, respectively. The transistors 11a–11d have their drain electrodes grounded and their gate electrodes connected to the search lines 5a–5d, respectively. The transistors 10a–10d and transistors 11a–11d operate as a match section for matching the data stored in the memory sections of the memory cells 1a–1d and the data set on the search lines 5a–5d. In FIG. 2, the same components as those of FIG. 1 are designated by the same reference numerals, and the description thereof is omitted here.

Next, the operation of the present embodiment 1 will be described.

Figure 3:
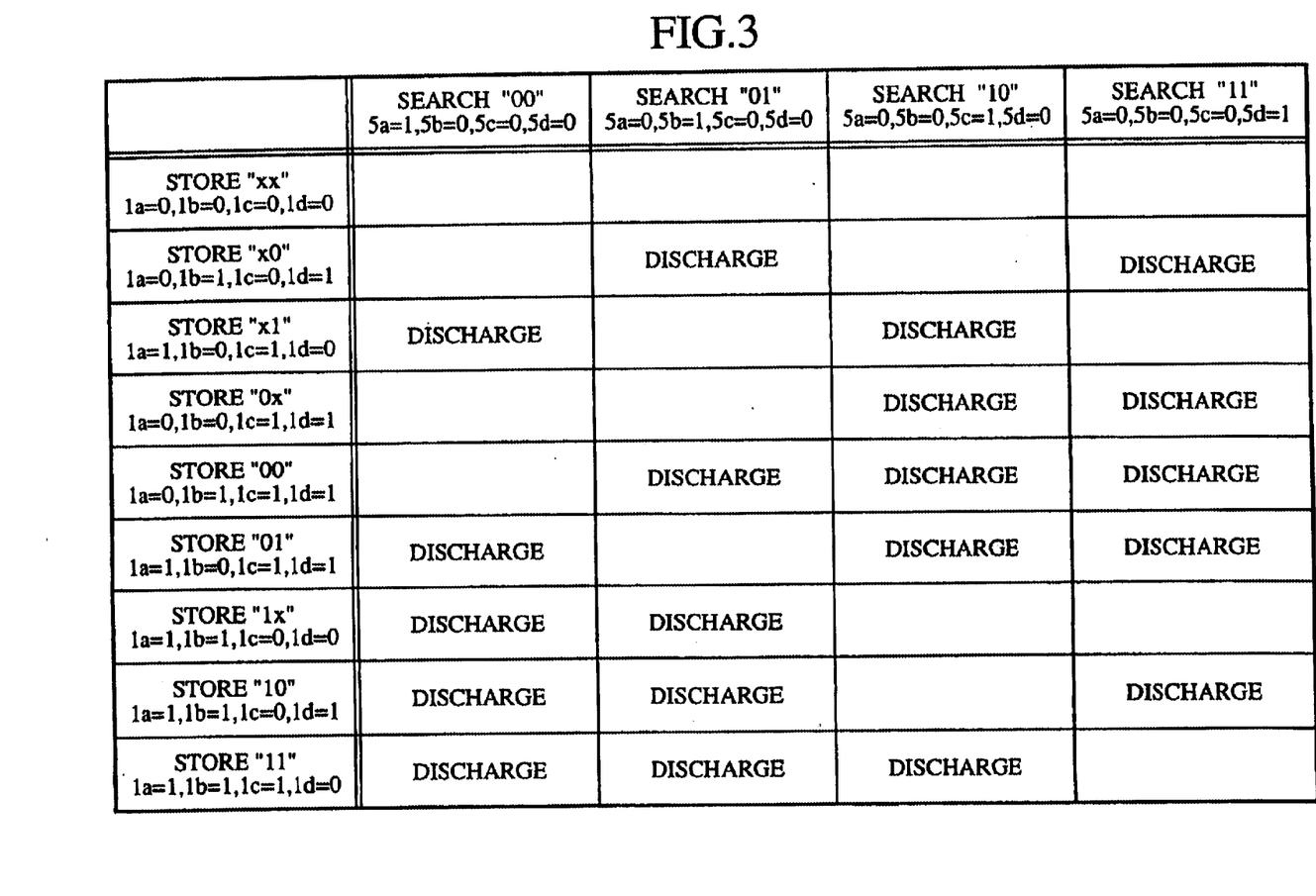
FIG. 3 is a table showing search results for combinations of memory data in the CAM cell block and search data.

The present embodiment 1 of the semiconductor memory carries out content search processing which outputs search results in response to combinations of the memory data in the CAM cell blocks and the search data as shown in FIG. 3, for example. FIG. 3 shows relationships between the memory data stored in the CAM cell block corresponding to <n+1:n> of FIG. 2 and the search data set on the search lines 5a–5d. Here, the content search processing will be described within the range as shown in FIG. 3. In the matrix consisting of the memory data stored in the CAM cell block and the search data in FIG. 3, blanks indicates that the search results are "match", and the combinations denoted by "discharge" indicate that the search results are "mismatch".

First, preprocessing of the content search processing is carried out. The memory cells 1a–1d are preset by 4-bit data expressing one of the memory data "xx", "x0", "x1", "0x", "00", "01", "1x", "10", and "11" in the memory data column of the CAM cell block in FIG. 3. The setting operation is the same as the normal data write to the memory cells 1a–1d. More specifically, the word line 2 is activated to bring the memory sections of the memory cells 1a–1d and the bit lines 4a–4d into conduction via the transistors 12a–12d. Then, the 4-bit digital data corresponding to the memory data placed on the bit lines 4a–4d are stored in the memory sections of the memory cells 1a–1d.

Subsequently, the charge processor, which consists of the transistors 6 in the example of FIG. 2, precharges the match lines 3 with the charges from the power supply in synchronism with search cycles. The gate electrodes of the transistors 6 are activated in synchronism with the search cycles. Thus, the transistors 6, switching the paths between the power supply and the match lines 3, carries out the precharge to the match lines 3.

Once the match lines 3 have been precharged, the search data setting section 7 places on the search lines 5a–5d the 4-bit data expressing one of the 2-bit search data "00", "01", "10", and "11" in the search data row of FIG. 3. In this case, only one of the search lines 5a–5d is activated for one of the search data "00", "01", "10" and "11". In other words, only one of the search lines 5a–5d is activated to be set at the digital value "1" in each cycle of the content search processing.

For example, the 2-bit search data "00" is expressed by the 4-bit digital value "1000" consisting of digital values "1", "0", "0" and "0" set in the search lines 5a, 5b, 5c and 5d. Likewise, the 2-bit search data "01", "10" and "11" are expressed by the 4-bit data "0100", "0010" and "0001" placed on the search lines 5a–5d, respectively.

When the search data setting section 7 places the search data on the search lines 5a–5d, the match section, which includes the transistors 10a–10d and 11a–11d in the memory cells 1a–1d of the CAM cell block of FIG. 2, compares the digital value stored in the memory cells 1a–1d with the digital value placed on the search lines 5a–5d, and makes a decision as to the match/mismatch between them.

The transistors 11a–11d are opened or closed in response to the charge states of the search lines 5a–5d on which the search data setting section 7 sets the search data. Specifically, when the digital value "1" is placed on one of the search lines 5a–5d, the corresponding one of the transistors 11a–11d is closed so that the corresponding one of the transistors 10a–10d has its source electrode grounded. In this case, when the corresponding one of the memory sections of the memory cells 1a–1d stores the digital value "1", the corresponding one of the transistors 10a–10d is closed and the match line 3 is grounded.

In contrast with this, when the digital value "0" is placed on the search lines 5a–5d, or the memory sections of the memory cells 1a–1d store the digital value "0", the transistors 10a–10d or transistors 11a–11d are opened, and the match line 3 is not grounded.

For example, when the memory cells 1a–1d store the memory data "x0", the memory cells 1a–1d store the digital values "0", "1", "0" and "1" as shown in FIG. 3. When the search data setting section 7 places the search data "01" (or "11") on the search lines 5a–5d in this case, digital values "0", "1", "0 " and "0" (or "0", "0", "0" and "1") are set on the search lines 5a–5d.

In this case, since the memory section of the memory cell 1b (or memory cell 1d) stores the digital value "1", the transistor 10b (or transistor 10d) is closed. In addition, since the digital value "1" is placed on the search line 5b (or search line 5d), the transistor 11b (or transistor 11d) is also closed. Thus, the charges precharged on the match line 3 are discharged through the transistors 10b and 11b (or transistors 10d and 11d).

Incidentally, when the memory cells 1a–1d store the memory data "xx", it must produce "match" for any search data. In other words, the memory data of the memory cells 1a–1d are set such that the match line 3 must not be discharged even if any of the search lines 5a–5d are activated. More specifically, as shown in FIG. 3, the digital value "0" is set to all the memory cells 1a–1d so that the transistors 10a–10d, which undergo the switching control by the digital value stored in the memory sections, are all opened.

The foregoing matching causes the potential of the match line 3 to be amplified by the amplifier 8 and output via the output terminal 9. When the output value from the output terminal 9 is digital value "1", that is, high level, it indicates that the memory data stored in the CAM cell block "matches" to the search data. In contrast, when the output value from the output terminal 9 is digital value "0", that is, low level, it indicates that the memory data stored in the CAM cell block "mismatches" with the search data.

Figure 4:
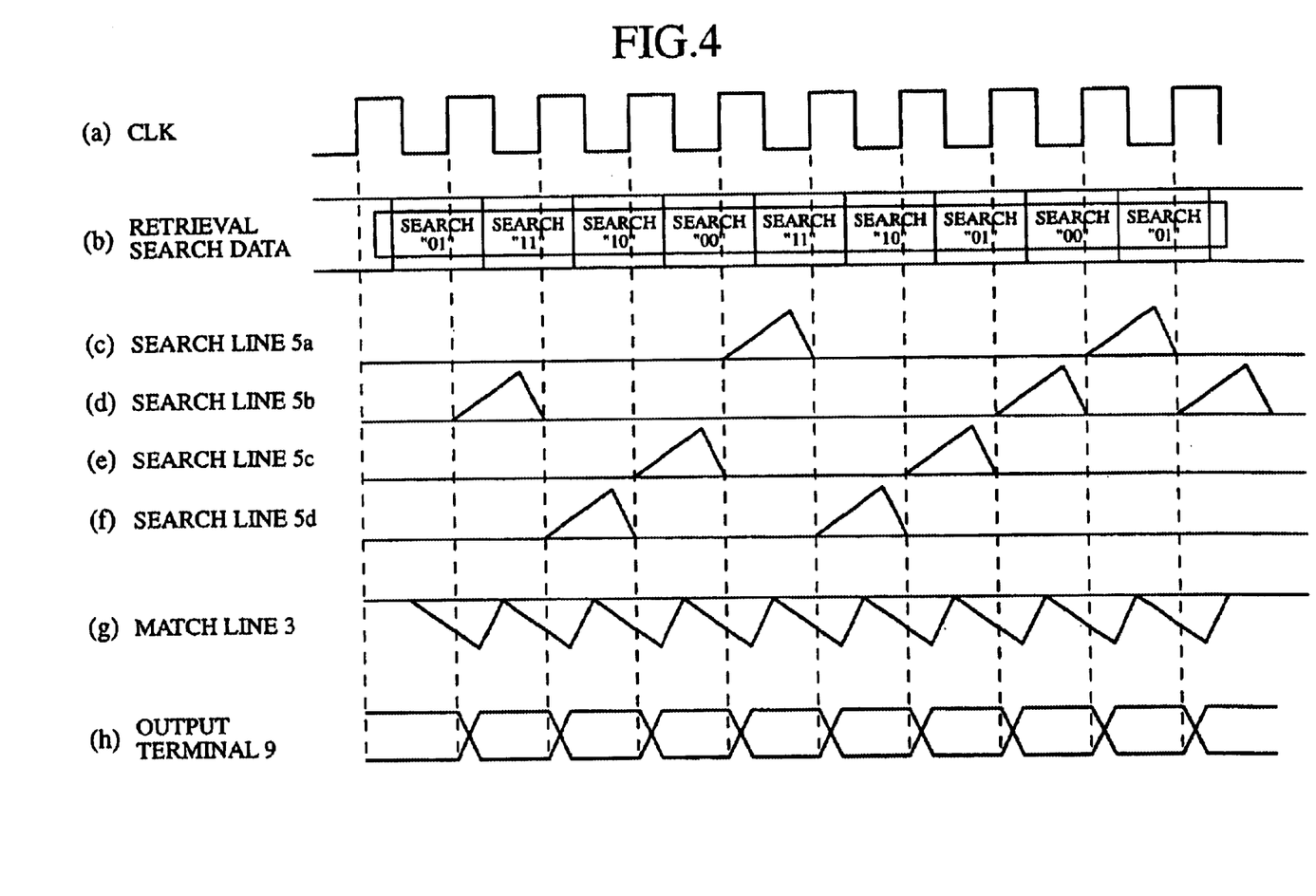
FIG. 4 is a timing chart illustrating the search operation of the embodiment 1 of the semiconductor memory.

FIG. 4 is a timing chart illustrating the content search operation of the embodiment 1 of the semiconductor memory. In FIG. 4, the symbol "CLK" designates a clock signal fed from the outside. The content search operation is carried out in the search cycles synchronized to the external clock. The "retrieval search data" in FIG. 4 indicates the search data that is being searched for. As illustrated in FIG. 4, the present embodiment 1 of the semiconductor memory activates only one of the search lines 5a–5d in each search cycle. Thus, it can reduce the number of search lines to be activated in each search cycle to ¼ as compared with the conventional semiconductor memory as shown in FIG. 9.

As for the conventional semiconductor memory which carries out the matching between the memory data and the search data by assigning one memory data to each CAM cell, the search line connected to each CAM cell (one of the search lines connected to the pair of the memory cells) must be activated in each search cycle without exception.

In contrast with this, the semiconductor memory in accordance with the present invention is configured as follows. First, two CAM cells, each of which consists of two memory cells, constitute one CAM cell block. Second, each combination of the four digital values stored in the memory cells in the CAM block is expressed in terms of 2-bit memory data (encoded to 2-bit memory data). Third, a combination of the four digital values placed on the search lines connected to the individual memory cells constituting the CAM cell block is also expressed in terms of 2-bit search data (encoded to 2-bit search data).

The configuration makes it possible to set the search data without activating all the search lines connected to the individual memory cells constituting the CAM cell block. Thus, it can reduce the power consumption of the content search processing. In addition, expressing the 2-bit search data by the 4-bit data "1000", "0100", "0010" and "0001" including only one digital value "1" can reduce the number of search lines, which are activated during each search cycle for each CAM cell block, to one. In this case, considering the fact that about 40% of the power consumption in the search operation is ascribable to "charging and discharging of the search lines", and that the number of search lines subjected to the charge and discharge is halved, the total power consumption is expected to be reduced by about 20%.

As described above, the present embodiment 1 includes: a CAM cell block that includes memory cells 1a–1d for storing four 1-bit digital values and stores memory data expressing a combination of the four digital values in the form of a 2-bit digital value; search lines 5a–5d that are connected to the memory cells 1a–1d constituting the CAM cell block and each hold a 1-bit digital value to be matched with the digital values stored in the memory cells 1a–1d; a search data setting section 7 that places 1-bit digital values on the four search lines connected to the memory cells 1a–1d constituting the CAM cell block to place the search data expressing the combination of the 4-bit digital values in terms of the 2-bit digital value; a match section composed of the transistors 10a–10d and 11a–11d that match the digital value stored in the memory cells 1a–1d constituting the CAM cell block with the digital value placed on the search lines 5a–5d connected to the memory cells 1a–1d to make a decision as to the match/mismatch between the memory data and search data; and a match line 3 for outputting the decision result. Thus, the present embodiment 1 can reduce the activation frequency of the search lines in the search operation, thereby enabling the power consumption in the search operation.

In addition, the present embodiment 1 is configured as follows. First, the CAM cell block includes two CAM cells each for storing one of the ternary values "0", "1" and "X (don't care)", and stores the memory data expressing the nine (square of 3) combinations of the data in the CAM cells in terms of the 2-bit digital values. Second, the search data setting section 7 charges one of the four search lines connected to the memory cells constituting the CAM cell block to set the search data expressing the combinations of the 4-bit digital values in the form of the four 2-bit digital values. As a result, it can reduce the number of the search lines to be activated in one search cycle for each CAM cell block to one, thereby being able to reduce the power consumption in the search operation.

Figure 5:
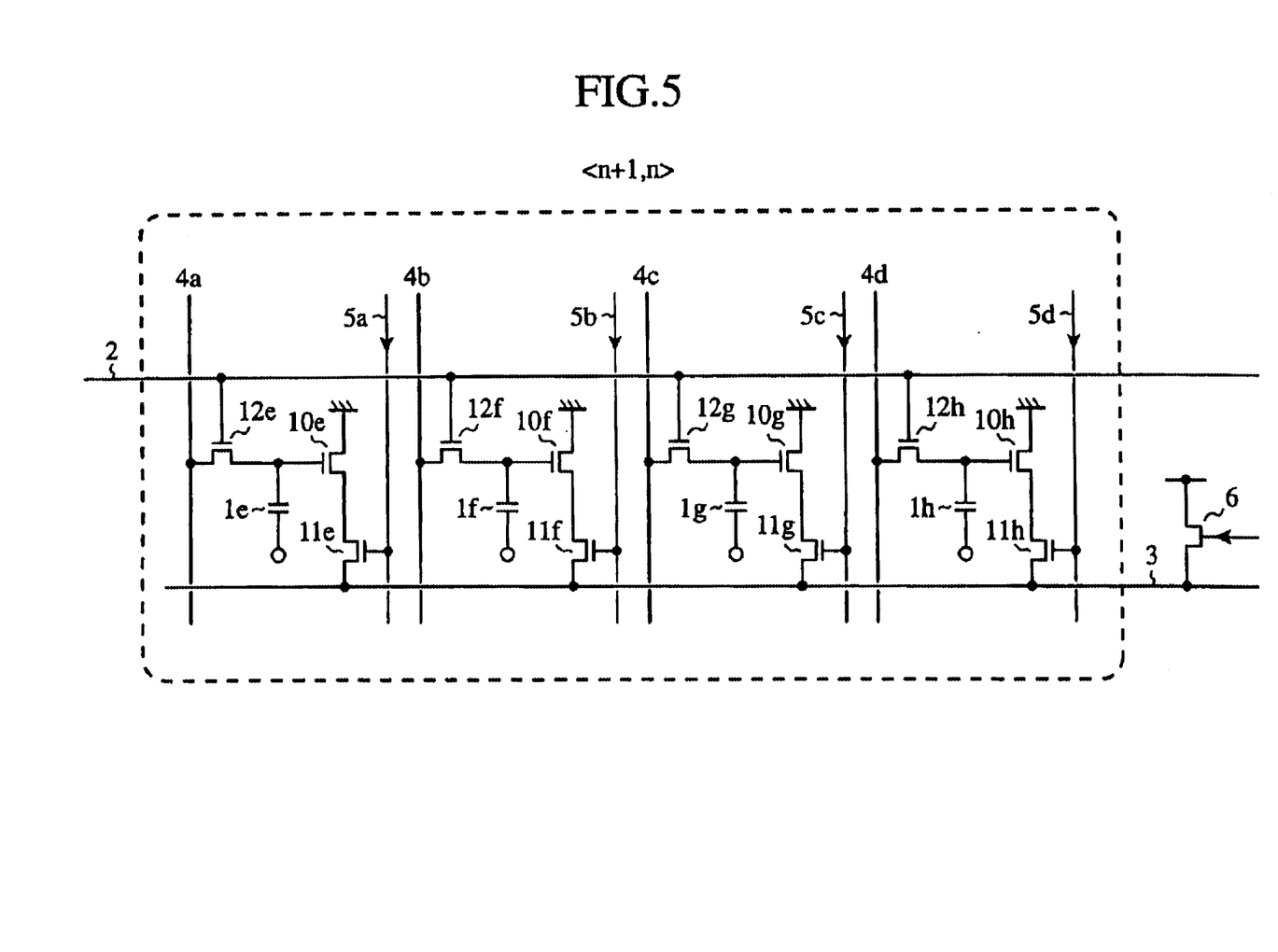
FIG. 5 is a circuit diagram showing another configuration of the CAM cell block.

Incidentally, the CAM cell block can be configured as shown in FIG. 5. The example of FIG. 5 employs dynamic-type cells as the memory cells. The memory sections of the memory cells 1e–1h each utilize a data storage capacitor. As for the memory cells 1e–1h, their transistors 12e–12h have their gate electrodes connected to the word line 2, and their source electrodes connected to the bit lines 4a–4d. Transistors 10e–10h have their gate electrodes connected to the nodes of the data storage capacitors of the memory cells 1e–1h, their source electrodes connected to the source electrodes of the transistors 11e–11h, and their drain electrodes grounded.

The transistors 11e–11h have their gate electrodes connected to the search lines 5a–5d, and their drain electrodes connected to the match line 3. The transistors 10e–10h and 11e–11h operate as the match section for matching the data stored in the data storage capacitors of the memory cells 1e–1h with the data set on the search lines 5a–5d. In FIG. 5, the same components as those of FIG. 1 are designated by the same reference numerals, and the description thereof is omitted here.

The configuration of FIG. 5 enables the operation similar to that of the foregoing embodiment 1, thereby offering similar advantages. In addition, as compared with the configuration of the foregoing embodiment 1, the configuration of FIG. 5 can reduce the number of transistors, thereby being able to reduce the area occupied by the semiconductor memory on a silicon substrate in fabricating it.

Although the foregoing embodiment 1 describes an example in which the bit lines, search lines, word lines and match lines are provided separately, this is not essential. For example, such configurations are possible in which the bit lines function as the search lines, or the word lines function as the match lines.

Although the foregoing embodiment 1 describes an example in which the CAM cell block are composed of the two CAM cells, each consisting of a pair of memory cells, this is not essential. For example, the CAM cell block can be composed of L memory cells, where L is an integer equal to mth power of 2 and is greater than four, and can store memory data expressing combinations of digital values stored in the individual memory cells in terms of M-bit digital values, where M is an integer equal to or greater than two.

Furthermore, advantages similar to those of the foregoing embodiment 1 are obtained by the following configuration. The CAM cell block with the above-mentioned configuration stores one of the $3^M$ M-bit memory data, which expresses a combination of the digital values in the individual memory cells in terms of the ternary values "0", "1" and "X (don't care)". Then, the search data setting section 7 charges only one of the L search lines connected to the memory cells constituting the CAM cell block to set the search data expressing a combination of the L-bit digital values in terms of an M-bit digital value.

Embodiment 2

Figure 6:
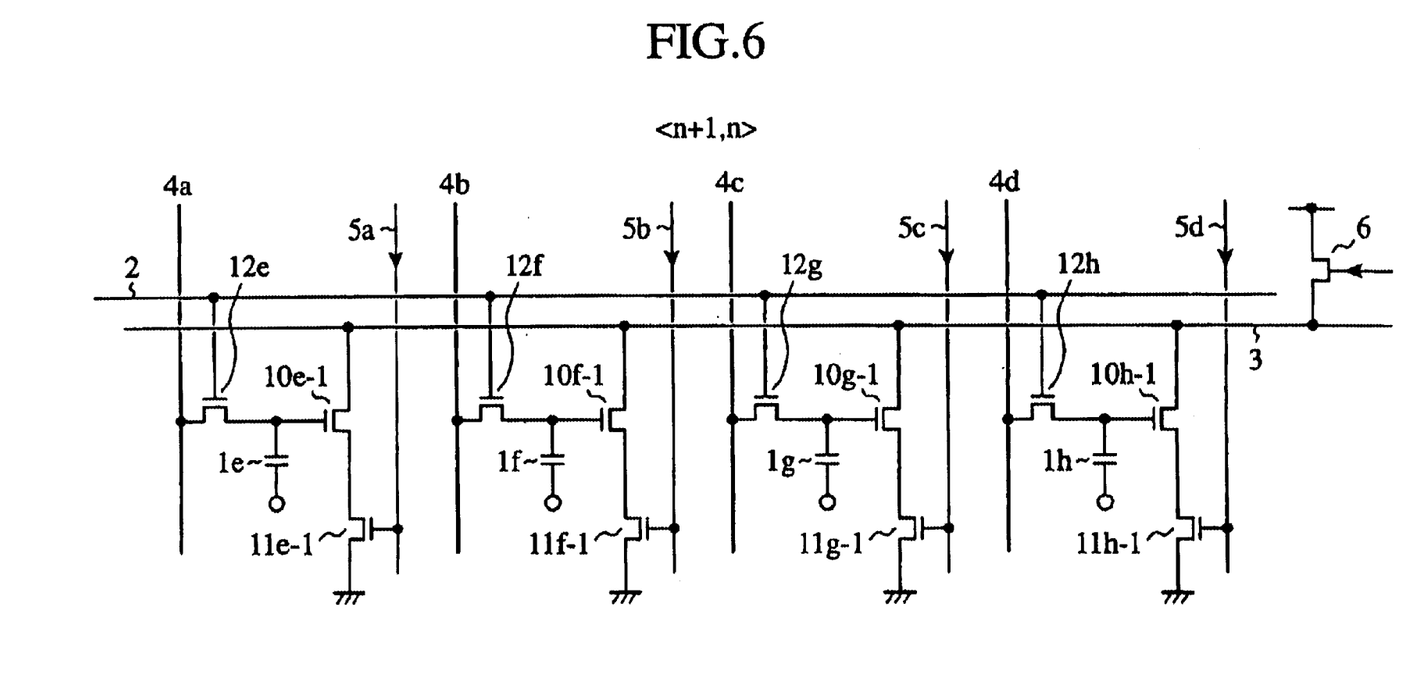
FIG. 6 is a circuit diagram showing a configuration of a CAM cell block of an embodiment 2 of the semiconductor. memory in accordance with the present invention.

FIG. 6 is a circuit diagram showing a configuration of a CAM cell block of an embodiment 2 of the semiconductor memory in accordance with the present invention. The present embodiment 2 uses the dynamic-type cells as the memory cells just as the memory cell block shown in FIG. 5. It uses data storage capacitors as the memory sections of the memory cells 1e–1h. The transistors 12e–12h of the memory cells 1e–1h have their gate electrodes connected to the word line 2, and their source electrodes connected to the bit lines 4a–4d, respectively.

The transistors 10e-1–10h-1(first MOS transistors) have their gate electrodes connected to the nodes of the data storage capacitors, their source electrodes connected to the source electrodes of transistors 11e-1–11h-1, and their drain electrodes connected to the match line 3. The transistors 10e-1–10h-1 each have a gate insulating film (oxide film) thinner than that of the transistors 12e–12h to exhibit the behavior as will be described below. Here, the thickness of the gate insulating film of the transistors 12e–12h is 5.7 nm, and that of the transistors 10e-1–10h-1 is 2.5 nm, for example.

The transistors 11e-1–11h-1 (second MOS transistors) have their gate electrodes connected to the search lines 5a–5d, and their drain electrodes grounded. The transistors 10e-1–10h-1 and 11e-1–11h-1 operate as the match section for matching the data stored in the data storage capacitors of the memory cells 1e–1h with the data set on the search lines 5a–5d . The configuration of FIG. 6 differs from that of FIG. 5 in that the pairs of transistors 10e-1–10h-1 and 11e-

1–11h-1 connected in series constituting the match section are connected to the match line 3 and ground level in the opposite manner to their counterparts of FIG. 5.

When the individual data storage capacitors of the memory cells 1e–1h are charged to the high level by placing their digital values to "1", they exhibit the refresh behavior of an ordinary dynamic-type RAM: The high level charges are gradually discharged because of the junction leakage of the transistors 12e–12h. In addition, the data storage capacitors have their high level charges leaked to the match line 3 through the gates of the transistors 10e-1–10h-1.

Figure 7A:
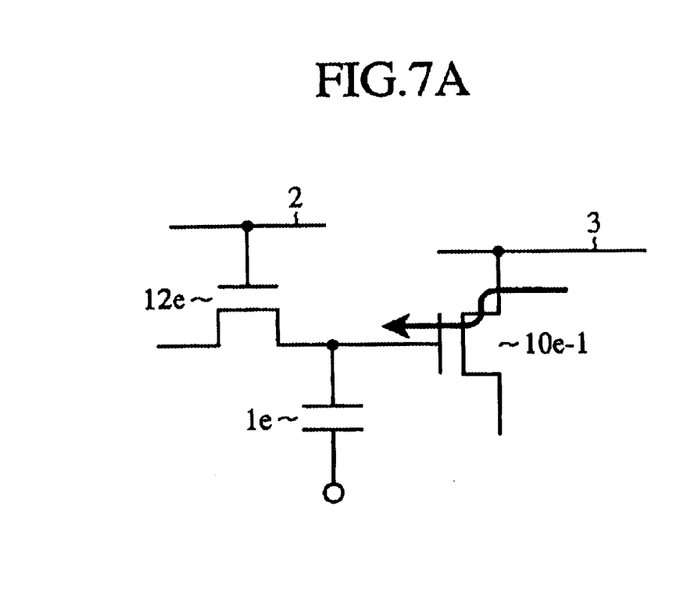
FIGS. 7A and 7B are diagrams illustrating the behavior of the memory cells constituting the CAM cell block of FIG. 6.

As described above, the thickness of the gate insulating film of the transistors 10e-1–10h-1 is made thinner (2.5 nm, for example) than that of the transistors 12e–12h so that the gate leakage value of the former becomes substantially equal to an ordinary junction leakage value. If the configuration can compensate for the charges evaporated as the junction leakage by passing the changes from the match line 3 through the gate leakage of the transistors 10e-1–10h-1 in the direction of the arrow as illustrated in FIG. 7A, the refresh time of the memory cells 1e–1h will become indefinite ideally.

Figure 7B:
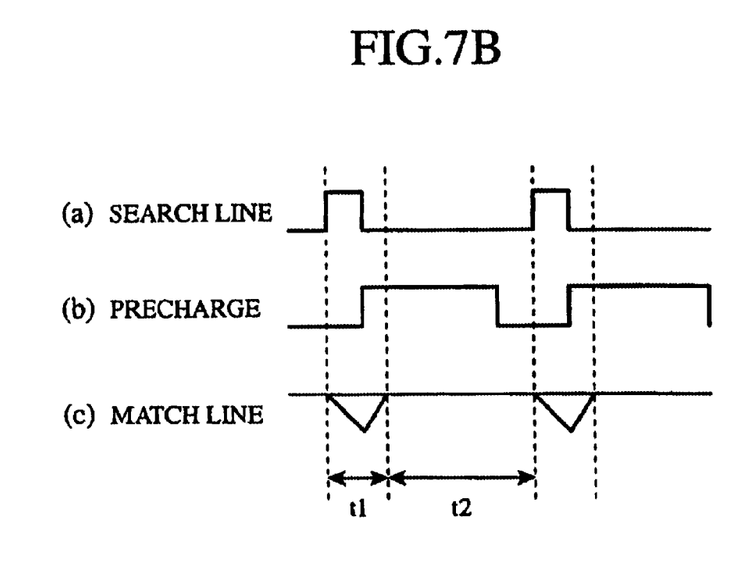

As concrete processing, as illustrated in FIG. 7B, the time t1 the search data setting section 7 takes to set the search data by charging the search lines is made shorter than the time t2 the charge processor 6 takes to precharge the match line 3. Thus, the gate leakage of the transistors 10e-1–10h-1 occurs in the direction of the arrow of FIG. 7A, which can prolong the refresh time of the data storage capacitors.

Figure 8:
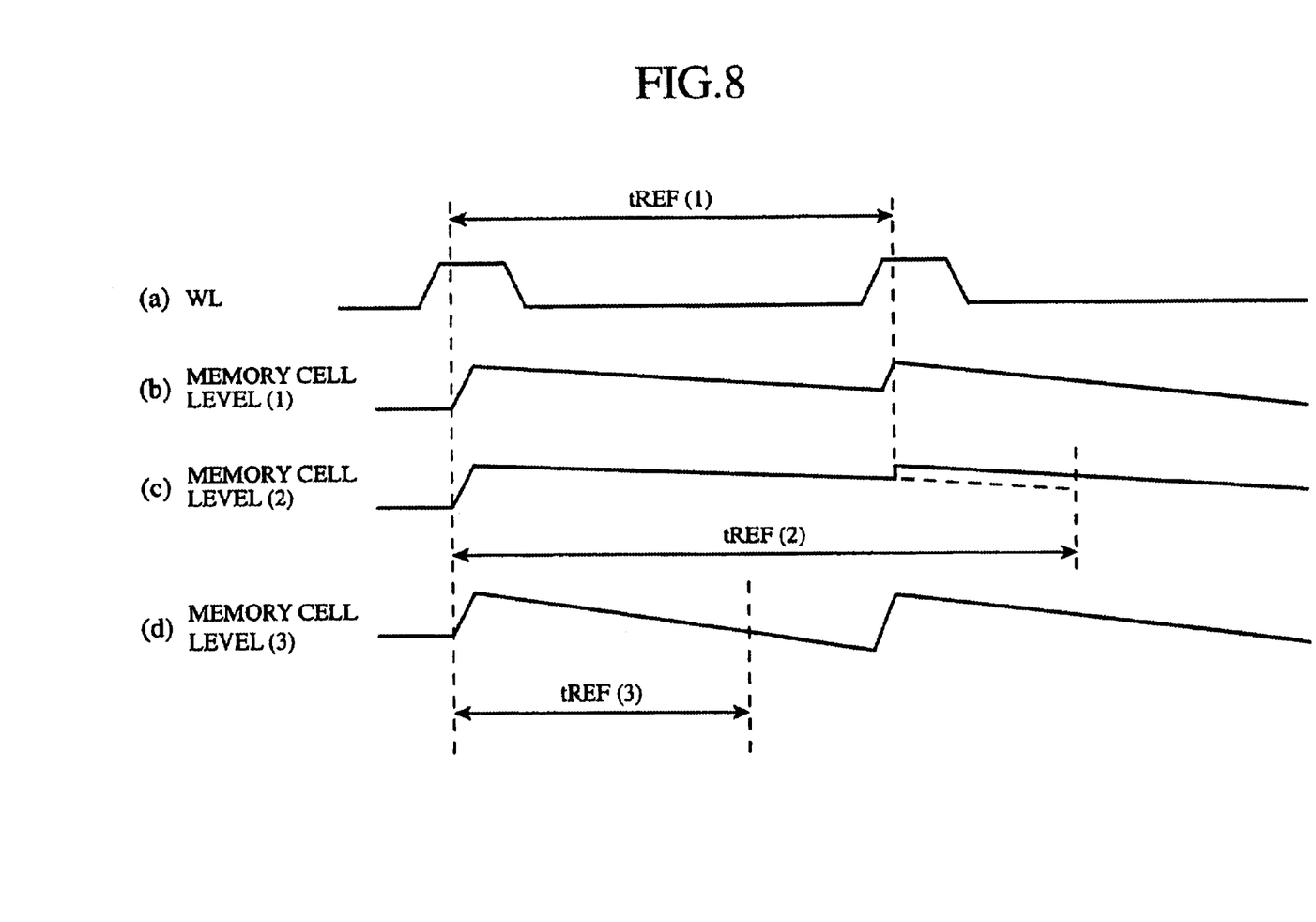
FIG. 8 is a timing chart illustrating the behavior of the memory cells after precharging a match line.

For example, as illustrated in FIG. 8, a conventional dynamic-type RAM has a charge state corresponding to a memory cell level (1) during an activating cycle of the word line 2 denoted by WL (refresh time tREF(1)). In contrast with this, the present embodiment 2 can achieve a charge state corresponding to a memory cell level (2), thereby being able to prolong the refresh time from tREF(1) to tREF(2), and to improve the refresh characteristic considerably.

Incidentally, if the thickness of the gate insulating films of the transistors 10e–10h is made too thin as compared with that of the transistors 12e–12h in the configuration of FIG. 5, a charge state corresponding to a memory cell level (3) can appear during an activating cycle of the word line 2 denoted by WL, which will shorten the refresh time from tREF(1) to tREF(3). Accordingly, the refresh characteristic is deteriorated as compared with that of the conventional dynamic-type RAM.

As described above, the present embodiment 2 is configured as follows. First, the memory cells 1e–1h consist of dynamic-type memory cells composed of transistors 12e–12h disposed on a lattice consisting of the word lines 2 and bit lines 4a–4d intersecting with each other, and the data storage capacitors for storing 1-bit digital values. Second, the match section is composed such that the transistors 10e-1–10h-1 open and close the paths to the match line 3 in response to the charge states of the data storage capacitors, and the transistors 11e-1–11h-1 open and close the paths to the ground level in response to the charge states of the search lines 5a–5d. Third, the match line 3 is charged in a longer time than charging the search lines 5a–5d. This is implemented by making the thickness of the gate insulating films of the transistors 10e-1–10h-1 thinner than that of the transistors 12e–12h to enable the charges stored on the match line 3 to be leaked to the data storage capacitors through the gate electrodes, and to enable the charge leakage from the match line 3 through the gate electrodes of the transistors 10e-1–10h-1 to compensate for the charges stored in the data storage capacitors. As a result, besides the advantages of the foregoing embodiment 1, the present embodiment 2 can implement the CAM cells with the dynamic-type cell configuration capable of improving the refresh characteristic.

What is claimed is:

1. A semiconductor memory comprising:
    a memory cell block that consists of L memory cells each for storing 1-bit digital value, where L is an integer equal to mth power of 2, and stores memory data expressing a combination of digital values stored in the individual memory cells in terms of an M-bit digital value, where M is a positive integer equal to or greater than two;
    search lines on which 1-bit digital values are set to be matched with the digital values stored in the memory cells;
    a search data setting section for setting search data expressing the combination of the L-bit digital values in terms of the M-bit digital value by setting the 1-bit digital values on the L search lines;
    a match section for making a match/mismatch decision between the memory data and the search data by matching the digital value stored in the memory cells constituting the memory cell block with the digital value set on the search lines connected to the memory cells; and
    an output section for outputting a decision result of said match section.

2. The semiconductor memory according to claim 1, wherein said memory cell block stores the memory data expressing the combination of the digital values stored in the individual memory cells in terms of $3^m$ M-bit digital values consisting of ternary values "0", "1" and "X (don't care)", and wherein
    said search data setting section sets the search data expressing the combination of L-bit digital values in terms of M-bit digital values by charging only one of the L search lines connected to the memory cells constituting said memory cell block.

3. The semiconductor memory according to claim 1, wherein said memory cell block is composed of two CAM cells, each of which stores data expressing a combination of digital values stored in a pair of memory cells in terms of ternary values "0", "1" and "X (don't care)", said memory cell block storing memory data expressing one of $3^2$ combinations of the data stored in said CAM cells in terms of a 2-bit digital value; and
    said search data setting section charges only one of the four search lines connected to the memory cells constituting said memory cell block to set the search data expressing one of the combinations of the 4-bit digital values in terms of four 2-bit digital values.

4. The semiconductor memory according to claim 1, wherein each of said memory cells is composed as a dynamic-type memory cell comprising:
    a MOS transistor disposed at an intersection of a lattice formed by word lines and bit lines intersecting with each other; and a data storage capacitor for storing 1-bit digital value.

5. The semiconductor memory according to claim 4, wherein said output section includes a match line that is precharged every time said match section carries out matching, and outputs a charge state of the match line after the matching as a decision result of the match/mismatch between the memory data and search data;

said match section includes first MOS transistors that have their gate electrodes connected to nodes of the data storage capacitors, and open and close paths to the match line in response to charge states of the data storage capacitors, and that have gate insulating films with a thickness enabling charges on the match line to be leaked to the data storage capacitors via the gate electrodes, and second MOS transistors that have their gate electrodes connected to the search lines, and open and close paths to a ground in response to charge states of the search lines, said first MOS transistors and second MOS transistors connecting the match line to the ground when they close the paths; and a charge processor for charging the match line for a time longer than a time said search data setting section takes to charge the search lines to compensate for charges in the data storage capacitors by using charges on the match line flowing through gate leakage of said first MOS transistors.

* * * * *